(12) United States Patent
Ohtsuki et al.

(10) Patent No.: US 7,910,966 B2
(45) Date of Patent: Mar. 22, 2011

(54) SOLID STATE IMAGING DEVICE INCLUDING A SEMICONDUCTOR SUBSTRATE ON WHICH A PLURALITY OF PIXEL CELLS HAVE BEEN FORMED

(75) Inventors: Hirohisa Ohtsuki, Hyogo (JP); Hiroyuki Doi, Kyoto (JP); Motonari Katsuno, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/425,029

(22) Filed: Apr. 16, 2009

(65) Prior Publication Data

US 2009/0294815 A1   Dec. 3, 2009

(30) Foreign Application Priority Data

May 28, 2008   (JP) .................................. 2008-139225

(51) Int. Cl.
*H01L 31/062* (2006.01)
(52) U.S. Cl. ........................................ 257/292; 257/293
(58) Field of Classification Search .............. 257/88–90, 257/98, 99, 100, 262, 368, 375, 389, 390, 257/401, 292, 293
See application file for complete search history.

(56) References Cited

U.S. PATENT DOCUMENTS

| | | | |
|---|---|---|---|
| 5,965,875 A | 10/1999 | Merrill | |
| 2001/0012133 A1 | 8/2001 | Yoneda et al. | |
| 2002/0190254 A1* | 12/2002 | Turner et al. | 257/59 |
| 2006/0132633 A1* | 6/2006 | Nam et al. | 348/308 |
| 2006/0151793 A1* | 7/2006 | Nagai | 257/79 |
| 2007/0069248 A1 | 3/2007 | Ohta | |
| 2007/0210398 A1* | 9/2007 | Ohtsuki et al. | 257/431 |
| 2008/0277702 A1* | 11/2008 | Katsuno et al. | 257/292 |

FOREIGN PATENT DOCUMENTS

| | | |
|---|---|---|
| JP | 2001-230400 | 8/2001 |
| JP | 2002-513145 | 5/2002 |
| JP | 2006-073567 | 3/2006 |
| JP | 2006-286848 | 10/2006 |

\* cited by examiner

*Primary Examiner* — Wai-Sing Louie
*Assistant Examiner* — Bilkis Jahan
(74) *Attorney, Agent, or Firm* — McDermott Will & Emery LLP (57) ABSTRACT

A solid state imaging device including a pixel region where a plurality of pixel cells 10*r*1, 10*g*1-10*g*3, 10*b*1-10*b*2 . . . have been formed. When focusing on a red pixel cell whose color filter has the longer transmission peak wavelength and a blue pixel cell whose color filter has the shorter transmission peak wavelength, the distribution of substrate contacts is denser in a region in the vicinity of a photodiode in the red pixel cell than a region in the vicinity of a photodiode in the blue pixel cell.

6 Claims, 12 Drawing Sheets

SOLID STATE IMAGING DEVICE INCLUDING A SEMICONDUCTOR SUBSTRATE ON WHICH A PLURALITY OF PIXEL CELLS HAVE BEEN FORMED

BACKGROUND OF THE INVENTION (1) Field of the Invention

The present invention relates to a solid state imaging device including a semiconductor substrate on which a plurality of pixel cells have been formed, and in particular to the structure of a pixel region in a MOS type solid state imaging device.

(2) Description of the Related Art

In recent years, MOS type solid state imaging devices have been used as imaging devices in digital still cameras, etc. Each of the MOS type solid state imaging devices has a pixel region in which a plurality of pixel cells have been arranged two-dimensionally (for example, arranged in an array), and a circuit region for driving the pixel cells in the pixel region (Japanese Patent Application Publication No. 2001-230400, and Japanese Patent Application Publication No. 2006-286848). The following describes the structure of the pixel region in a MOS type solid state imaging device, with reference to FIG. 1.

Figure 1:
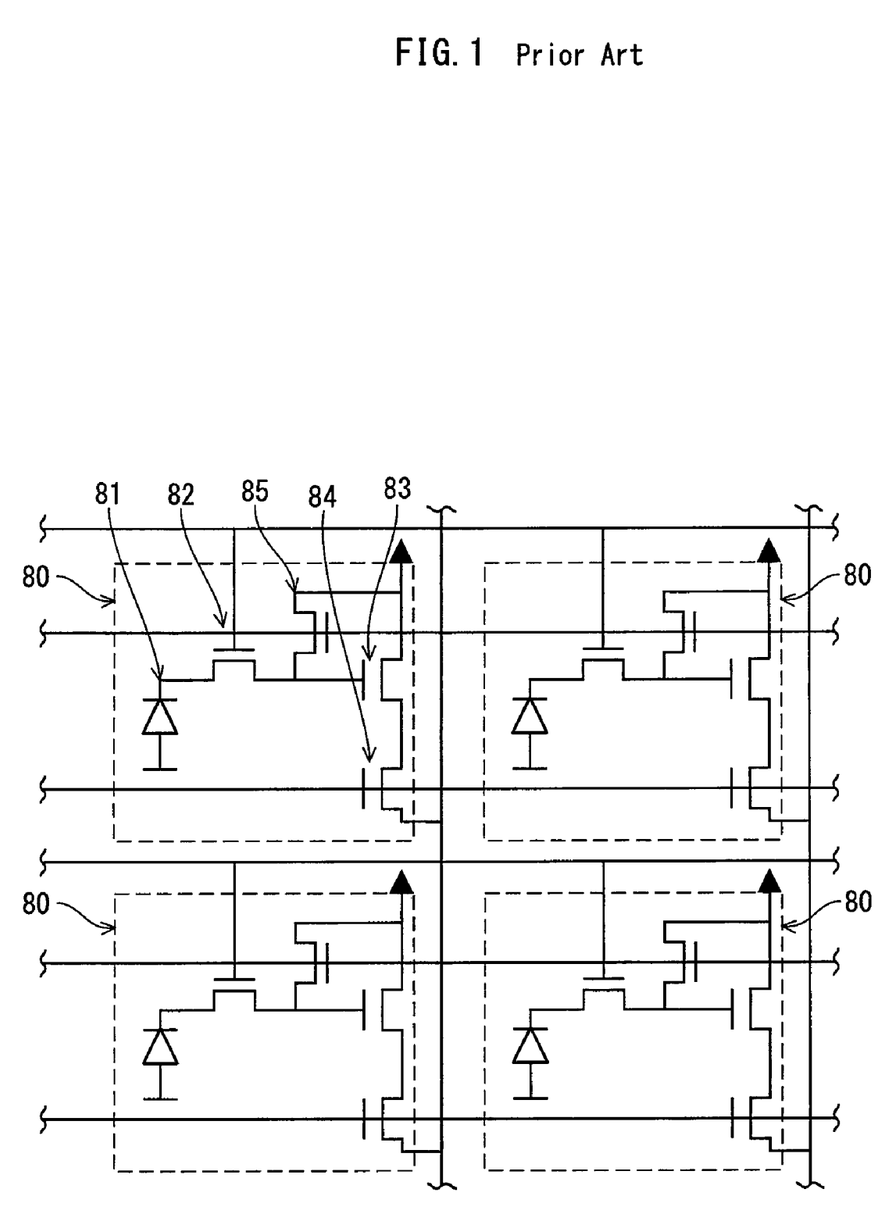
FIG. 1 is a circuit diagram showing the structure of a pixel cell 80 of a MOS type solid state imaging device according to a conventional technique.
Figure 2:
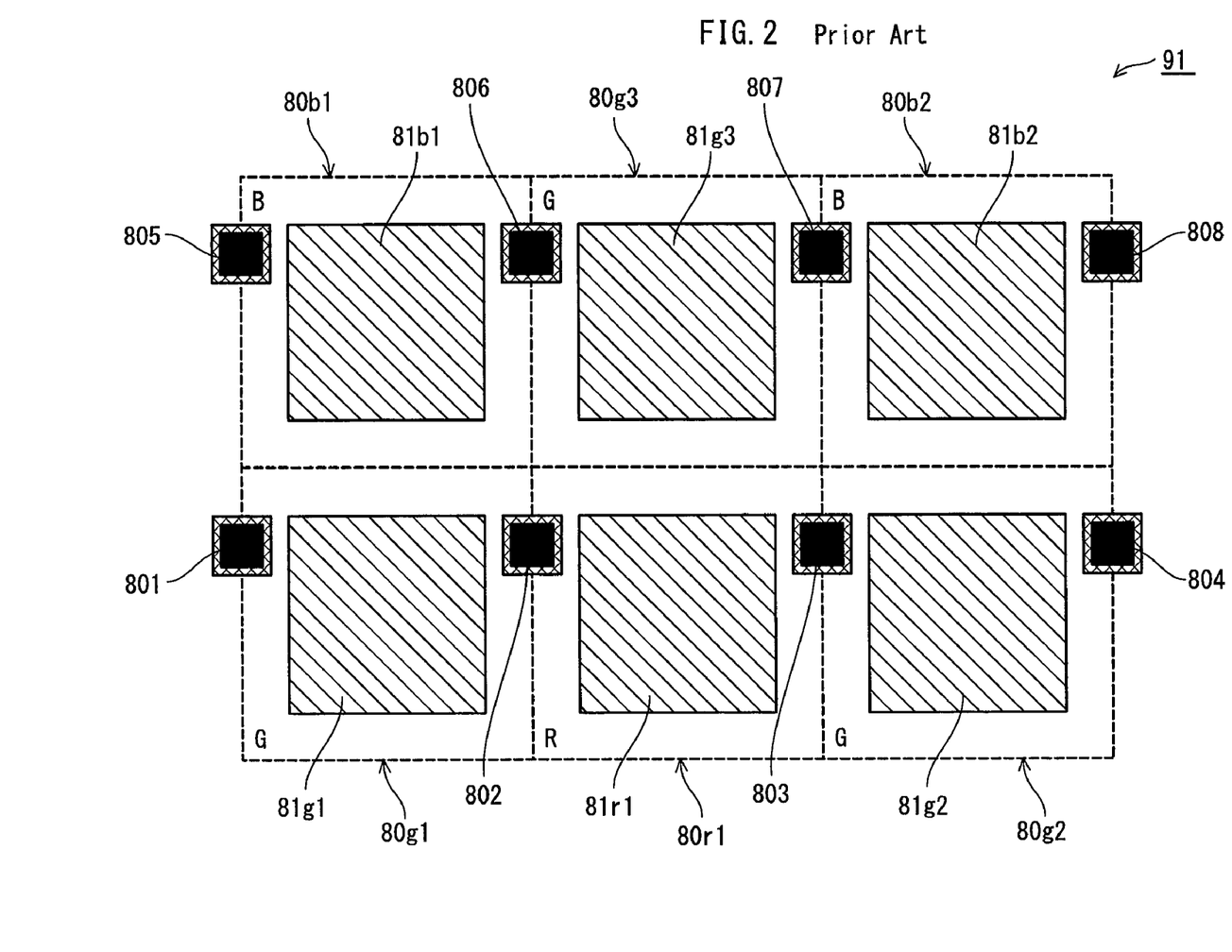
FIG. 2 is a schematic layout showing a relative positional relationship between (i) photodiodes 81r1, 81g1-81g3, and 81b1-81b2 and (ii) substrate contacts 801-808, in a pixel region 91 of the MOS type solid state imaging device according to the conventional technique.

As shown in FIG. 1, each pixel cell in the pixel region includes one photodiode 81 and four transistors (a transfer transistor 82, an amplification transistor 83, a selection transistor 84, and a reset transistor 85). These transistors 81-85 have been formed on a well region in a semiconductor substrate. Also, in a pixel region, a substrate contact (not shown in FIG. 1) has been arranged between pixel cells 80 that are adjacent to each other. The following describes an arrangement of the substrate contact, with reference to FIG. 2. FIG. 2 shows six pixel cells in a pixel region 91, namely red pixel cell 80r1, green pixel cells 80g1-80g3, and blue pixel cells 80b1-80b2.

As shown in FIG. 2, the blue pixel cell 80b1, the green pixel cell 80g3, and the blue pixel cell 80b2 have been arranged from the top left in the pixel region 91, and the green pixel cell 80g1, the red pixel cell 80r1, and the green pixel cell 80g2 have been arranged from the bottom left in the pixel region 91.

Note that the red pixel cell 80r1 includes a color filter that transmits red visible light (the wavelength being in the range of 575 [nm] to 700 [nm]), each of the green pixel cells 80g1-80g3 includes a color filter that transmits green visible light (the wavelength being in the range of 490 [nm] to 575 [nm]), and each of the blue pixel cells 80b1-80b2 includes blue visible light (the wavelength being in the range of 400 [nm] to 490 [nm]).

As shown in FIG. 2, in a MOS type solid state imaging device according to a conventional technique, substrate contacts 801-808 have been formed between adjacent pixel cells in the pixel region 91. The substrate contacts 801-808 have been formed by evenly spaced from the photodiodes 81r1, 81g1-81g3, and 81b1-81b2 of the pixel cells 80r1, 80g1-80g3, and 80b1-80b2.

As shown in FIG. 2, in the MOS type solid state imaging device, the substrate contacts 801 to 808 have been arranged in the pixel region 91, so as to stabilize a well potential. As a result, the transistors 82-85 in each of the pixel cells 80r1, 80g1-80g3, and 80b1-80b2 are operated at high speed and in a stable manner.

However, the MOS type solid state imaging device having the above-mentioned substrate contacts has a problem in which a large shading appears in the output signal due to progress in reducing the size of image pixels. In particular, shading that appears in the pixel cells 80b1 and 80b2 is larger than shading that appears in the other pixel cells, namely the pixel cells 80r1 and, 80g1-80g3, since the pixel cells 80b1 and 80b2 receive blue visible light having a short wavelength. The following describes a mechanism of how shading occurs in a MOS type solid state imaging device according to the conventional technique, with reference to FIG. 3.

Figure 3:
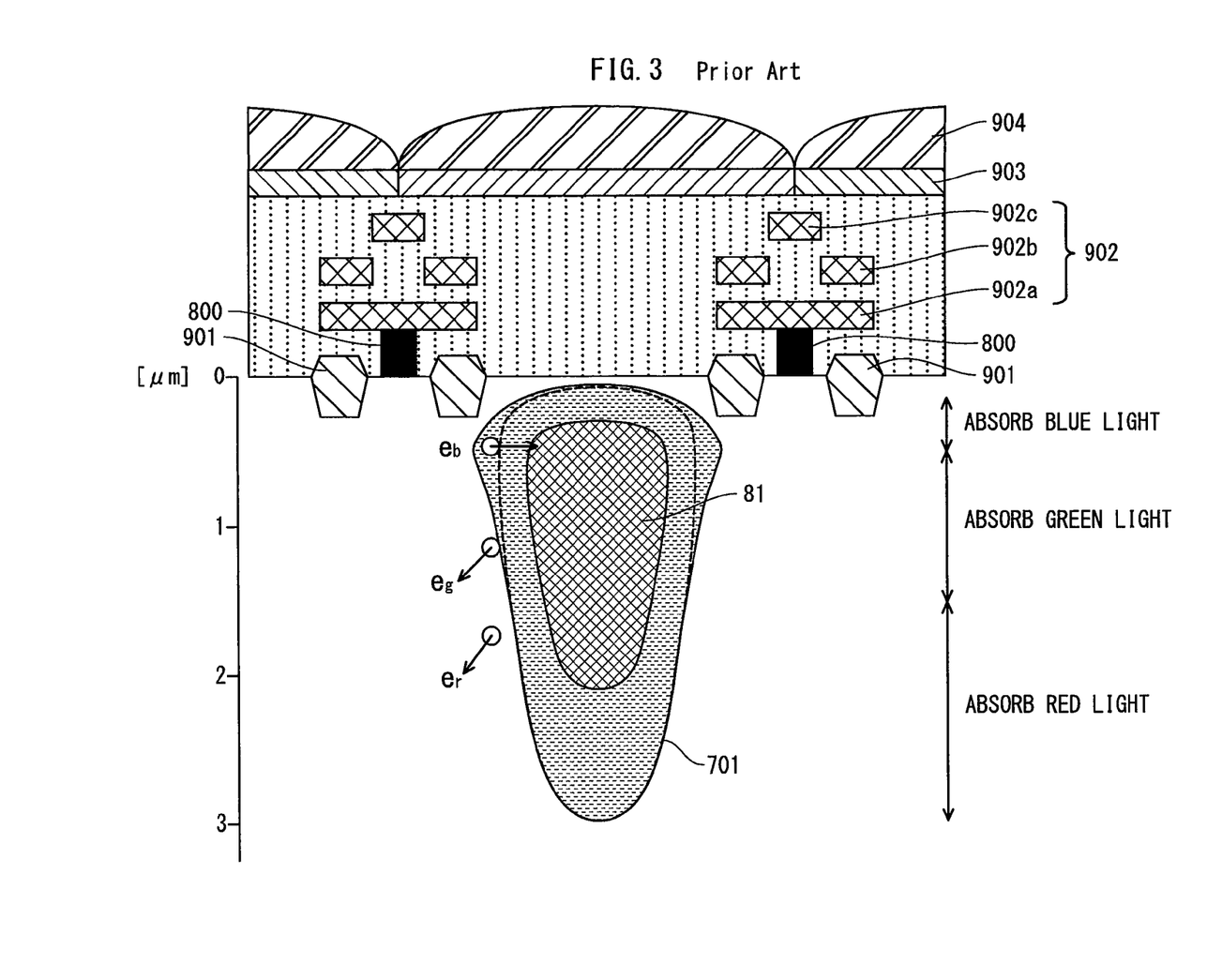
FIG. 3 is a sectional diagram schematically showing the structure of the pixel cell 80 in the MOS type solid state imaging device according to the conventional technique, and an absorption state of electrons $e_r$, $e_g$, and $e_b$ with respect to a photodiode 81.

As shown in FIG. 3, an isolation 901, wirings 902 (902a, 902b, and 902c), a color filter 903, and a top lens 904 have been formed in a pixel cell on a semiconductor substrate. Also, a substrate contact 800 has been formed on the semiconductor substrate in a portion corresponding to each side of the photodiode 81.

A reference number 701 in FIG. 3 shows a boundary (hereinafter referred to as "dividing ridge 701") where electrons generated by photoelectric conversion are absorbed by the photodiode 81. The electrons generated by the photoelectric conversion are likely to be concentrated on the photodiode 81, by repelling the existence of the substrate contact 800. As a result, the dividing ridge 701 spreads toward the substrate contact 800, in a shallow area of the semiconductor substrate.

Here, as shown in Japanese National Publication of the Translated Version of PCT Application, No. 2002-513145, a large part of blue visible light having a short wavelength (400 [nm] to 490 [nm]) is absorbed by the semiconductor substrate (silicon substrate) at a depth of approximately 0.2 [μm] to 0.5 [μm]. Consequently, as shown in FIG. 3, when the blue visible light enters the semiconductor substrate of a MOS type solid state imaging device according to the conventional technique, electrons are generated in a shallow area of the semiconductor substrate by the photoelectric conversion. Therefore, in a MOS type solid state imaging device according to the conventional technique, a sensitivity characteristic varies depending on a relative positional relationship between the substrate contact 800 and the photodiode 81, which particularly have a great impact on the pixel cells 80b1 and 80b2 that receive the incidence of the blue visible light, as described above.

Furthermore, shading occurs by a difference in an incident direction of blue light. In other words, the blue light enters pixels that are positioned upward (hereinafter referred to as "upper pixels") in the entirety of a pixel array of a solid state imaging device, in a manner that the blue light enters obliquely from a lower direction. Therefore, the photoelectric conversion occurs in an upper portion (in the vicinity of a region where the substrate contacts have been arranged) of the photodiode in each of the upper pixels, resulting in the upper pixels having a high sensitivity. On the contrary, the blue light enters pixels that are positioned downward (hereinafter referred to as "lower pixels") in the entirety of the pixel array of the solid state imaging device, in a manner that the blue light enters obliquely from an upper direction. Therefore, the photoelectric conversion occurs in a lower portion (in the vicinity of a region having no substrate contact) of the photodiode in each of the lower pixels, resulting in the lower pixels having a low sensitivity. As described above, shading occurs when a sensitivity difference occurs between the upper pixels and the lower pixels in the pixel array, due to a difference in the position of each substrate contact with respect to the direction of incident light.

Also, in a solid state imaging device having a multi-pixel one-cell structure, such as a four-pixel one-cell structure, there are (i) a photodiode for a blue pixel, the photodiode including the substrate contact arranged in the vicinity thereof and (ii) a photodiode for a blue pixel, the photodiode including the substrate contact not arranged in the vicinity thereof. This also causes a sensitivity difference between the photodiodes in the above-mentioned two pixels.

SUMMARY OF THE INVENTION

The object of the present invention has been achieved in view of the above-described problem, and an aim thereof is to provide a solid state imaging device that prevents an occurrence of shading regardless of the wavelength of incident visible light, while ensuring that transistors in pixel cells operate at high speed and in a stable manner, by stabilizing the reference potential of a substrate.

In order to achieve the above-described aim, the present invention has the following structure.

A solid state imaging device according to the present invention comprises: a plurality of photodiodes that have been arranged two-dimensionally with spacing between each other, in a semiconductor substrate, each of the photodiodes having a function of photoelectric conversion; a plurality of kinds of color filters, each of the color filters having been formed above the respective photodiodes and transmitting light that has, for each kind, a different peak wavelength; and a plurality of substrate contacts that have been respectively arranged in vicinity of some or all of the plurality of photodiodes, so as to apply a reference voltage to the semiconductor substrate.

In the solid state imaging device according to the present invention, the plurality of photodiodes include photodiodes that belong to a first group and photodiodes that belong to a second group such that color filters above the photodiodes of the first group have a longer transmission peak wavelength, and color filters above the photodiodes of the second group have a shorter transmission peak wavelength, and a distribution of the substrate contacts is denser in vicinity of (all of) the photodiodes in the first group than in vicinity of (all of) the photodiodes in the second group. For example, the solid state imaging device of the present invention is characterized in that the substrate contacts have not been formed in the vicinity of the photodiodes in the second group, and the plurality of substrate contacts have been formed in the vicinity of the photodiodes in the first group.

In a case where each of the substrate contacts has been formed in the vicinity of the plurality of photodiodes respectively, the substrate contacts in the vicinity of the photodiodes in the second group have been arranged closer to each other than the substrate contacts in the vicinity of the photodiodes in the first group.

The present invention may have any structure as long as the relative distribution density between (i) the substrate contacts that have been formed in the vicinity of the photodiodes in the first group and (ii) the substrate contacts that have been formed in the vicinity of the photodiodes in the second group satisfies the above-described relationship.

As described above, a solid state imaging device according to the present invention includes the substrate contacts that have been formed in a region (pixel region) in which the plurality of photodiodes have been arranged two-dimensionally. Therefore, in the solid state imaging device according to the present invention, it is possible to apply the reference potential to the semiconductor substrate (including a well), thereby stabilizing the potential (well potential) of the semiconductor substrate. As a result, in the solid state imaging device according to the present invention, the transistors in the pixel cells are operated at high speed and in a stable manner.

Also, in the solid state imaging device according to the present invention, the distribution of the substrate contacts is denser in the vicinity of the photodiodes in the first group than in the vicinity of the photodiodes in the second group. As described above, the color filters formed above the photodiodes that belong to the first group selectively transmit light having a peak wavelength that is longer than a peak wavelength of light transmitted by the color filters formed above the photodiodes that belong to the second group.

A large part of light having the shorter peak wavelength is absorbed by the semiconductor substrate at a depth of approximately 0.2 [μm] to 0.5 [μm], while light having the longer peak wavelength is absorbed by the semiconductor substrate at a depth that is deeper than the above-mentioned depth (see Japanese National Publication of the Translated Version of PCT Application, No. 2002-513145). As a result, the solid state imaging device according to the present invention is not easily affected by the above-described dividing ridge that spreads due to the substrate contacts, compared to a solid state imaging device according to the above-described conventional technique. This is because the distribution of the substrate contacts is dense in the vicinity of the photodiodes in the first group in the solid state imaging device according to the present invention, while the substrate contacts have been formed regardless of the peak wavelength of the incident light in the solid state imaging device according to the conventional technique.

Therefore, in the solid state imaging device according to the present invention, it is possible to prevent the occurrence of shading regardless of the wavelength of the incident visible light, while ensuring high-speed and stable operation of the transistors of the pixel cells, by stabilizing the reference potential of the substrate.

A structure according to the present invention is applicable to a solid state imaging device having a one-pixel one-cell structure, and is also applicable to a solid state imaging device having a multi-pixel one-cell structure.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

The following describes the preferred embodiments for carrying out the present invention, with reference to drawings. Note that the following embodiments are merely examples for the clear and detailed explanations of the structure of the present invention and the acts/effects achieved from the structure. Therefore the present invention shall not be limited to the embodiments described below, except essential characteristic parts thereof.

Embodiment 1

1. Overall Structure

Figure 4:
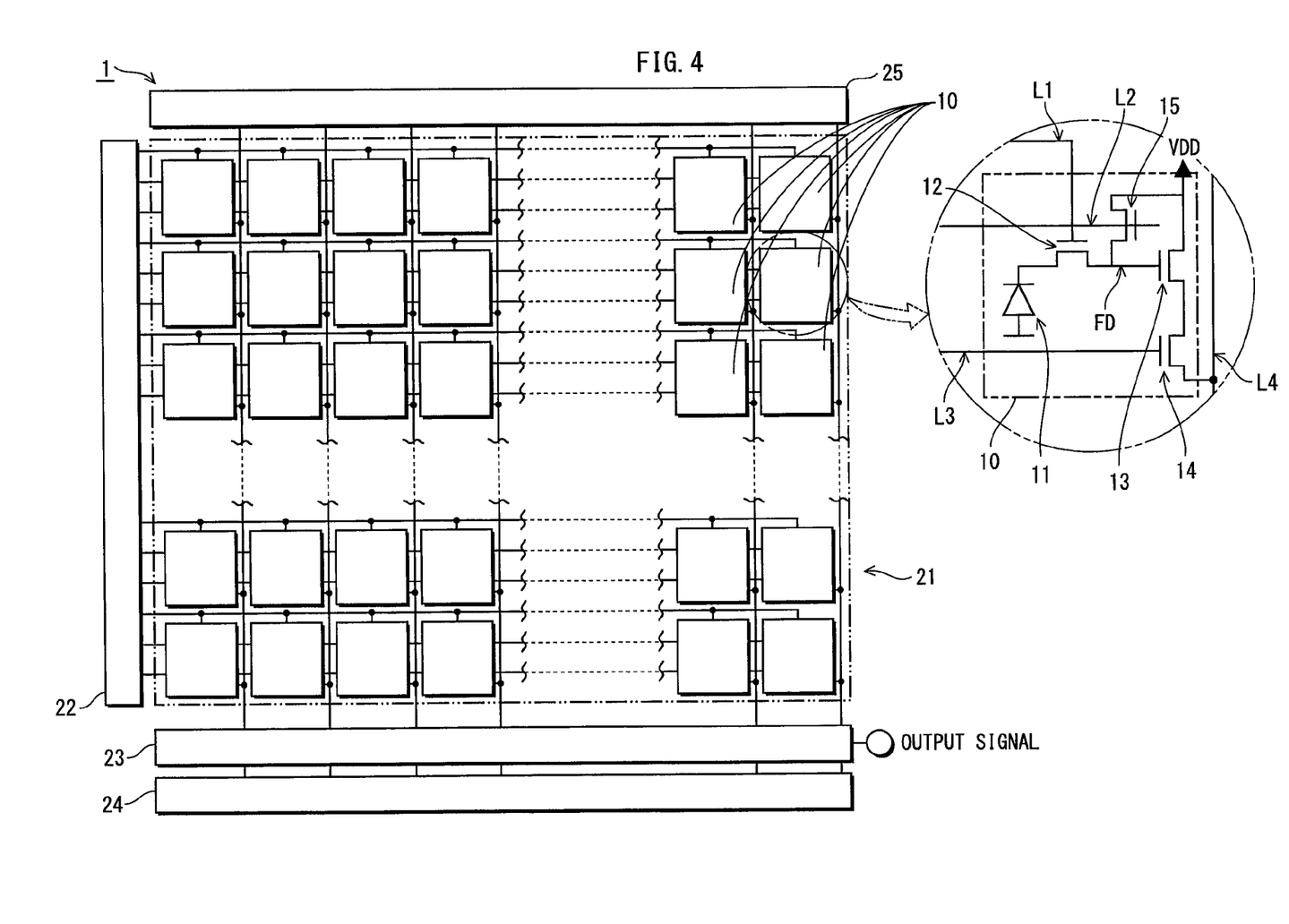
FIG. 4 is a block diagram showing the structure of a MOS type solid state imaging device 1 according to embodiment 1.

The following describes the overall structure of a MOS type solid state imaging device 1 according to the present embodiment, with reference to FIG. 4. The MOS type solid state imaging device 1 shown in FIG. 4 is used as an image input device such as a digital still camera or a digital movie camera.

As shown in FIG. 4, the MOS type solid state imaging device 1 according to embodiment 1 includes a pixel region 21 and a periphery circuit portion. The pixel region 21 is formed from a plurality of pixel cells 10, and the periphery circuit portion has been arranged on the periphery of the pixel region 21 so as to drive the pixel cells 10 in the pixel region 21. The periphery circuit portion includes a vertical scanning circuit 22, a read circuit 23, a horizontal scanning circuit 24 and a load circuit 25.

The plurality of pixel cells 10, which constitute the pixel region 21, have been arranged two-dimensionally in a semiconductor substrate. Note that, although the semiconductor substrate is not shown in FIG. 4, a direction along the main surface of the semiconductor substrate corresponds to a direction along the paper surface.

As shown in a portion surrounded by a chain double-dashed line in FIG. 4, each of the pixel cells 10 is an amplification-type unit pixel, and has a circuit configuration identical to each other. Each of the image pixel cells 10 includes a photodiode 11 and four transistors (a transfer transistor 12, an amplification transistor 13, a selection transistor 14, and a reset transistor 15), etc.

Between each of the image pixels 10 arranged in the horizontal direction of FIG. 4, the gate electrodes of the transfer transistors 12 are connected to each other by a wiring line L1, the gate electrodes of the reset transistors 15 are connected to each other by a wiring line L2, and the gate electrodes of the selection transistors 14 are connected to each other by a wiring line L3. Also, between each of the image pixels 10 arranged in the vertical direction of FIG. 4, the sources of the selection transistors 14 are connected to each other by a wiring line L4.

The photodiodes 11 is a device portion having a photoelectric conversion function that generates signal charge in accordance with intensity of incident light received by the corresponding pixel cell 10. Note that one end of the photodiode 11 is grounded, and another end thereof is connected to a source of the transfer transistor 12. The transfer transistor 12 is a device portion for transferring, to a drain thereof, the signal charge generated with use of the photoelectric conversion function of the photodiode 11. The drain of the transmission transistor 12 functions as a detection unit, and is connected to the gate electrode of the amplification transistor 13 and the source of the reset transistor 15. Note that one of the drain of the transfer transistor 12 and an extended portion of the transfer transistor 12 is a floating diffusion FD.

The reset transistor 15 is a device portion for resetting the signal charge accumulated in the floating diffusion FD in a predetermined cycle. A drain of the reset transistor 15 is electrically connected to power supply voltage VDD. The amplification transistor 13 is a device portion for outputting the signal charge accumulated in the floating diffusion FD in accordance with a signal from the vertical scanning circuit 22, etc., when the selection transistor 14 is turned on. A drain of the amplification transistor 13 is connected to the power supply voltage VDD, and a source of the amplification transistor 13 is connected to a drain of the selection transistor 14.

In the four transistors, namely transistors 12-15 in the pixel cell 10, the amplification transistor 13 performs an amplification function of the signal charge, and the other transistors 12, 14-15 each perform a switching function.

Note that although not shown in FIG. 4, each pixel cell 10 has a color filter 203 and a top lens 204. The color filters 203 include red color filters, green color filters, and blue color filters, and have been formed above the photodiodes 11. Also, each of the top lenses 204 has been formed on the color filter 203 of the respective color pixel cells 10 (see FIGS. 8 and 9). Also, in the MOS type solid state imaging device 1, a plurality of substrate contacts have been formed in the pixel region 21, so as to apply a reference potential (for example, 0 [V]) to the semiconductor substrate (now shown), which is described below.

2. Structure of Peripheral Region of Photodiode 11 in Each Pixel Cell 10

Figure 5:
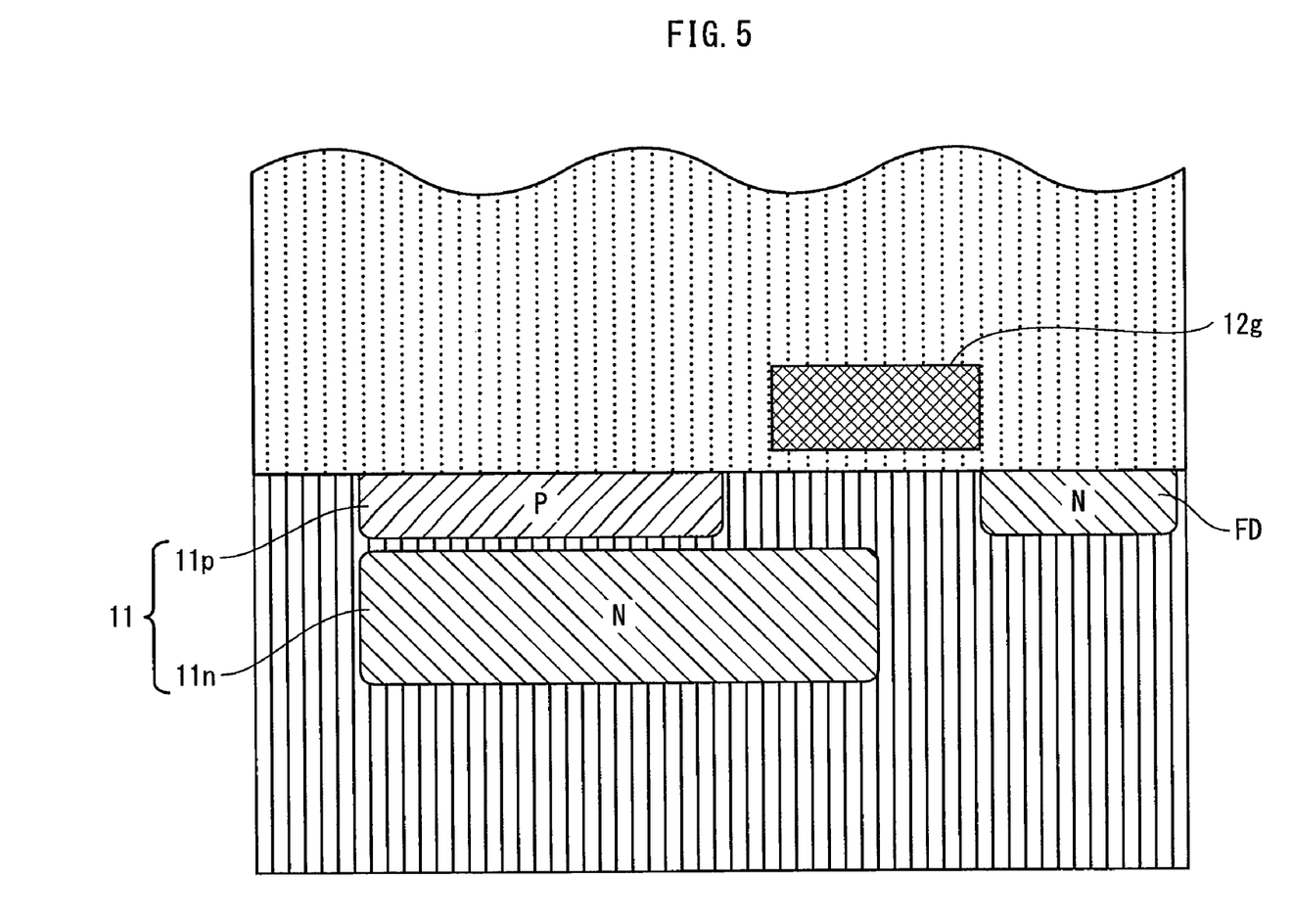
FIG. 5 is a sectional diagram showing a part of the structure of a pixel cell 10 in the MOS type solid state imaging device 1.

The following describes a structure in a peripheral region of the photodiode 11 in each pixel cell 10 in the MOS type solid state imaging device 1, with reference to FIG. 5.

As shown in FIG. 5, in the MOS type solid state imaging device 1 according to embodiment 1, the photodiode 11, the transfer transistor 12, and the floating diffusion FD have been formed from left to right in each pixel cell 10. The photodiode 11 includes a p-type doped region 11p and an n-type doped region 11n. The p-type doped region 11p has been formed on the upper portion of the photodiode 11, and the n-type doped region 11n has been formed on the lower portion of the photodiode 11. The reference number 12g denotes a gate of the transfer transistor 12.

In the MOS type solid state imaging device 1, the n-type doped region 11n in the photodiode 11 has been extended to a region located below the gate 12g of the transfer transistor 12.

The MOS type solid state imaging device having the above-described structure transfers all the signal charge generated in the photodiode 11 to the floating diffusion FD when reading data, compared to a case where the MOS type solid state imaging device does not have the structure in which the n-type doped region 11n has been extended to the region located below the gate 12g of the transfer transistor 12.

3. Substrate Contacts 101-104

Figure 6:
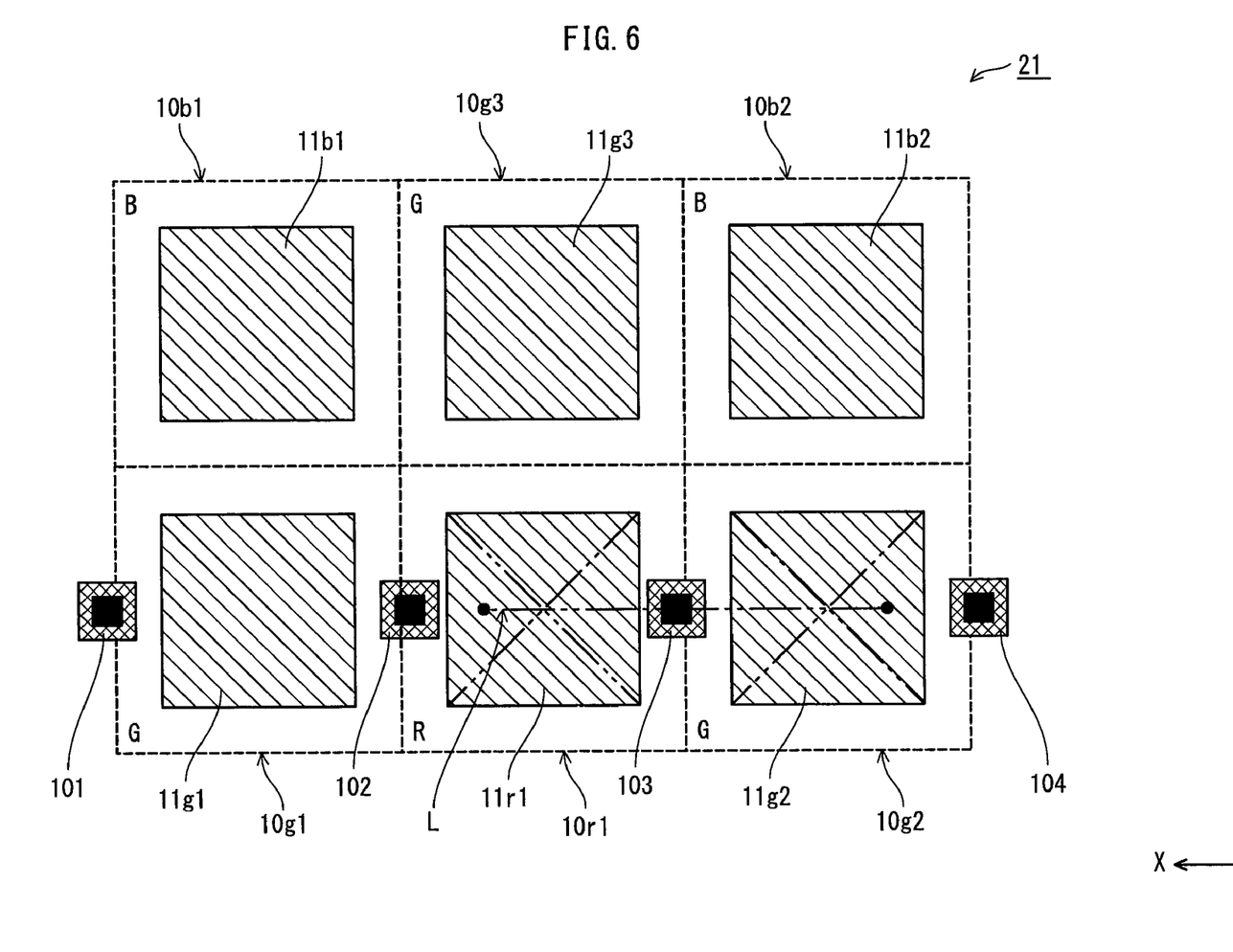
FIG. 6 is a schematic layout showing a relative positional relationship between (i) photodiodes 11r1, 11g1-11g3, and 11b1-11b2 and (ii) substrate contacts 101-104, in a pixel region 21.

The following describes a relative positional relationship between (i) photodiodes 11r1, 11g1-11g3, and 11b1-11b2 and (ii) substrate contacts 101-104, in the pixel region 21, with reference to FIG. 6. FIG. 6 schematically shows six pixel cells that have been extracted, namely 10r1, 10g1-10g3, and 10b1-10b2. In the six pixel cells, the photodiodes 11r1, 11g1-11g3, and 11b1-11b2, and the substrate contacts 101-104 are only shown.

In the pixel cell 10r1, the red color filter 203 (see FIGS. 8 and 9) has been provided above the photodiode 11r1. The photodiode 11r1 receives red visible light having a peak wavelength in the range of 575 [nm] to 700 [nm] inclusive.

Also, in the pixel cells 10g1-10g3, each of the green color filters 203 (see FIGS. 8 and 9) has been provided above the photodiodes 11g1-11g3, respectively. The photodiodes 11g1-11g3 receive green visible light having a peak wavelength in the range of 490 [nm] to 575 [nm] inclusive. Likewise, in the pixel cells 10b1-10b2, each of the blue color filters 203 (see FIGS. 8 and 9) has been provided above the photodiodes 11b1-11b2, respectively. The photodiodes 11b1-11b2 receive blue visible light having a peak wavelength in the range of 400 [nm] to 490 [nm] inclusive.

As shown in FIG. 6, in the MOS type solid state imaging device 1 according to embodiment 1, the substrate contacts 101-104 have been formed so as to be adjacent to the pixel cells 10g1, 10r1 and 10g2 in the pixel region 21. However, no substrate contact has been formed in portions that are adjacent to the pixel cells 10b1 and 10b2, which have been arranged in the upper portion in the Y-axial direction of FIG. 6.

The substrate contacts 102 and 103 have been formed so as to be closer to the pixel cell 10r1. In other words, the substrate contact 102 has been arranged so as to be closer to the photodiode 11g1 than the photodiode 11r1. Here, the photodiode 11g1 is in the pixel cell 10g1 that is located on the left side of the substrate contact 102, and the photodiode 11r1 is in the pixel cell 10r1 that is located on the right side of the substrate contact 102.

Also, as shown in FIG. 6, the substrate contacts 101-104 have been formed on a line L that is a line connecting the center points, in the Y-axial direction, of the photodiodes 11r1 and 11g1-11g2 in the pixel cells 10r1 and 10g1-10g2. With a structure as described above, the substrate contacts 101-104 are symmetrically arranged in the Y-axial direction, with respect to the photodiodes 11r1, and 11g1-11g2. As a result, the MOS type solid state imaging device 1 prevents variation in the sensitivity characteristic in the entirety of the pixel region 21, even in the incident direction of light.

4. Drive of MOS Type Solid State Imaging Device 1

Figure 7:
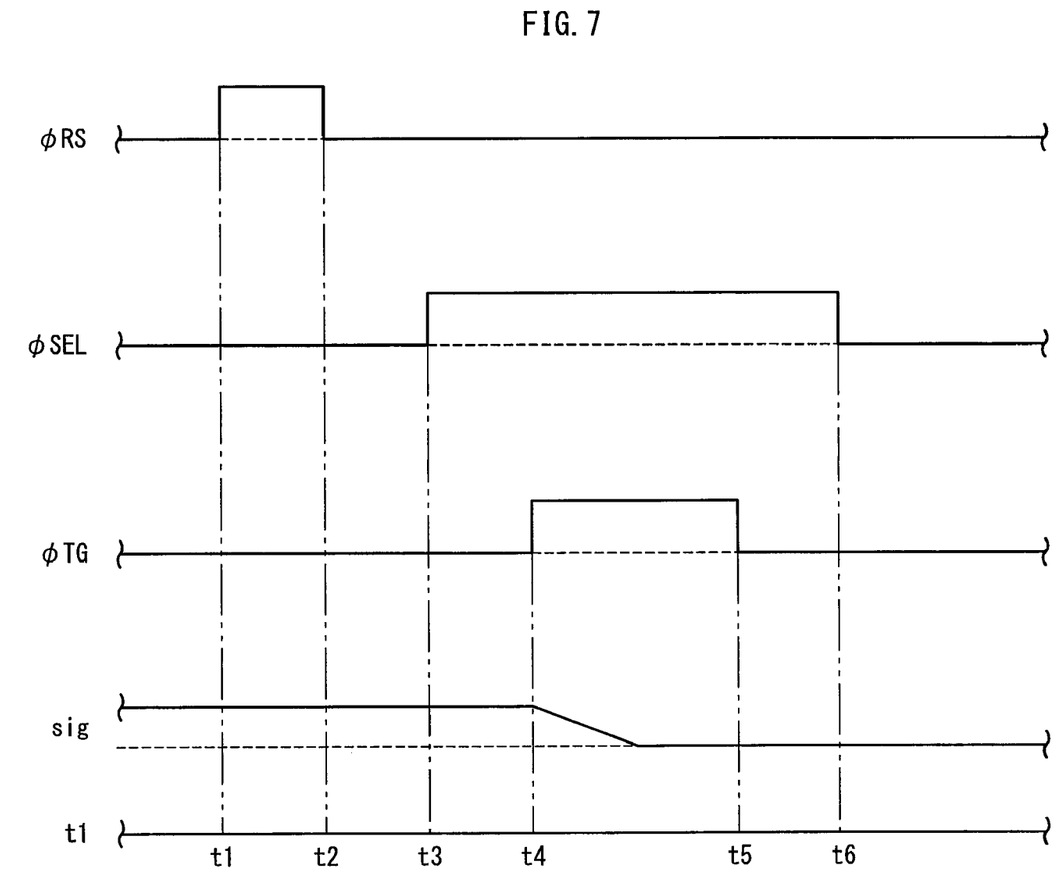
FIG. 7 is a timing chart related to the drive of the MOS type solid state imaging device 1.

The following outlines the drive of the MOS type solid state imaging device 1, with reference to FIG. 7.

In FIG. 7, a pulse ØRS is a control pulse for the on/off control of the reset transistor 15. Also, a pulse ØSEL is a control pulse for the on/off control of the selection transistor 14, and a pulse ØTG is a pulse for the on/off control of the transfer transistor 12.

As shown in FIG. 7, a High level control pulse ØRS is applied to the gate of the reset transistor 15 in a selected one of the pixel cells 10 on one horizontal line. As a result, the reset transistor 15 in the selected pixel cell 10 is turned on (timing t1).

Then, the control pulse ØRS is set to a Low level, so as to turn off the reset transistor 15 (timing t2). Subsequently, a High level control pulse ØSEL is applied to the gate of the selection transistor 14 in the pixel cell 10 (timing t3), so as to turn on the selection transistor 14. When the selection transistor is turned on, the potential of the wiring line L4 is stored in the read circuit 23.

Then, a High level control pulse ØTG is applied to the gate of the transfer transistor 12 (timing t4), so as to turn on the transfer transistor 12. When the transfer transistor 12 is turned on, electric charge that has been generated and accumulated by the photoelectric conversion in the photodiode 11 passes through the floating diffusion FD and is transferred to the gate of the amplification transistor 13.

The electric charge transferred to the gate of the amplification transistor 13 is converted into voltage information by the parasitic capacity, and is read to the wiring line L4 via the amplification transistor 13 and the selection transistor 14. The read circuit 23 outputs a difference between read data that has been converted into the voltage information and a pre-stored signal level.

After the above-described signal output process has been completed, the control pulse ØSEL and the control pulse ØTG are sequentially set to the Low level (timing t5 and t6).

5. Superiority of MOS Type Solid State Imaging Device 1

Figure 8:
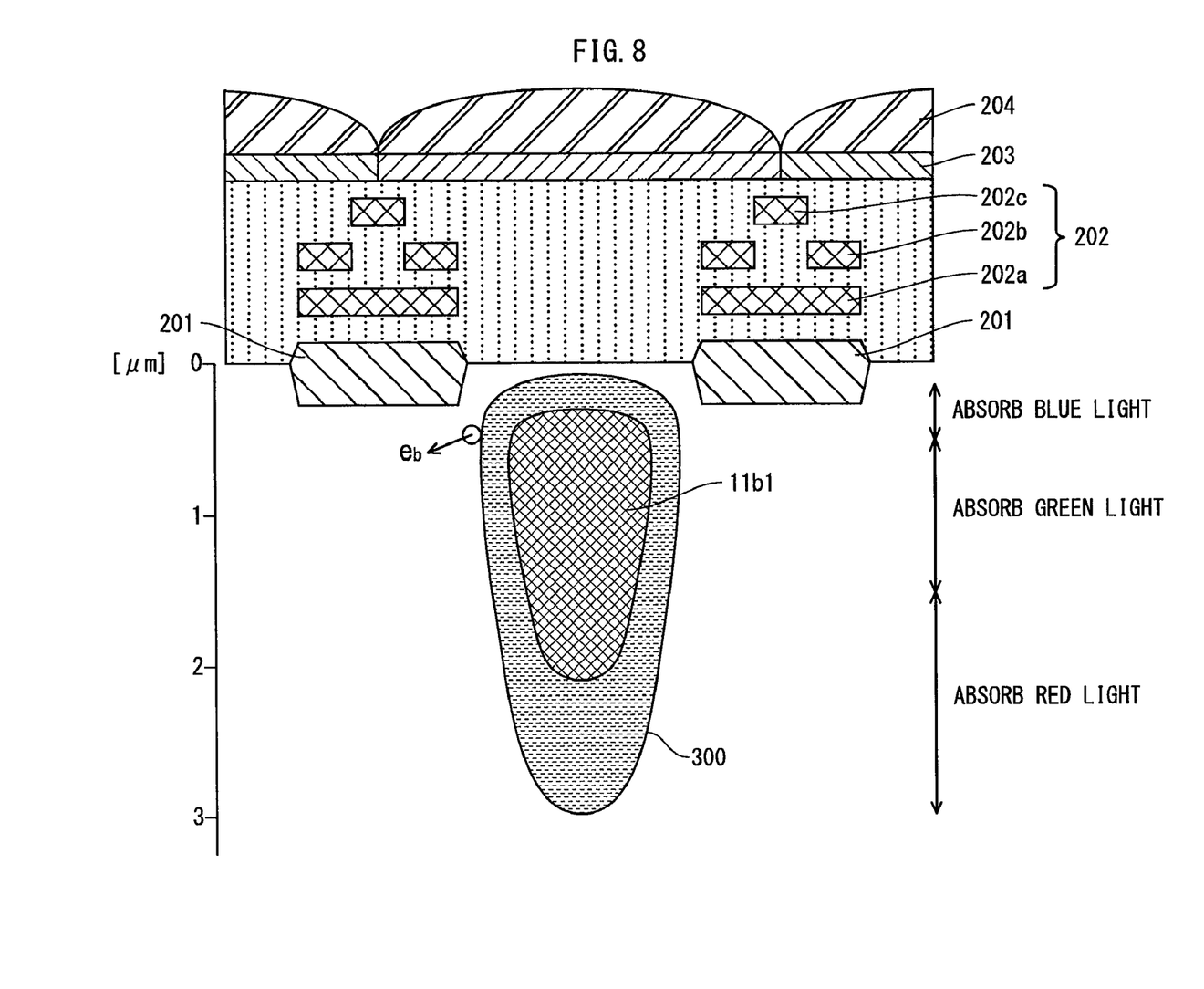
FIG. 8 is a sectional diagram schematically showing the structure of a blue pixel cell 10, and an absorption state of an electron $e_b$ with respect to the photodiode 11b1.
Figure 9:
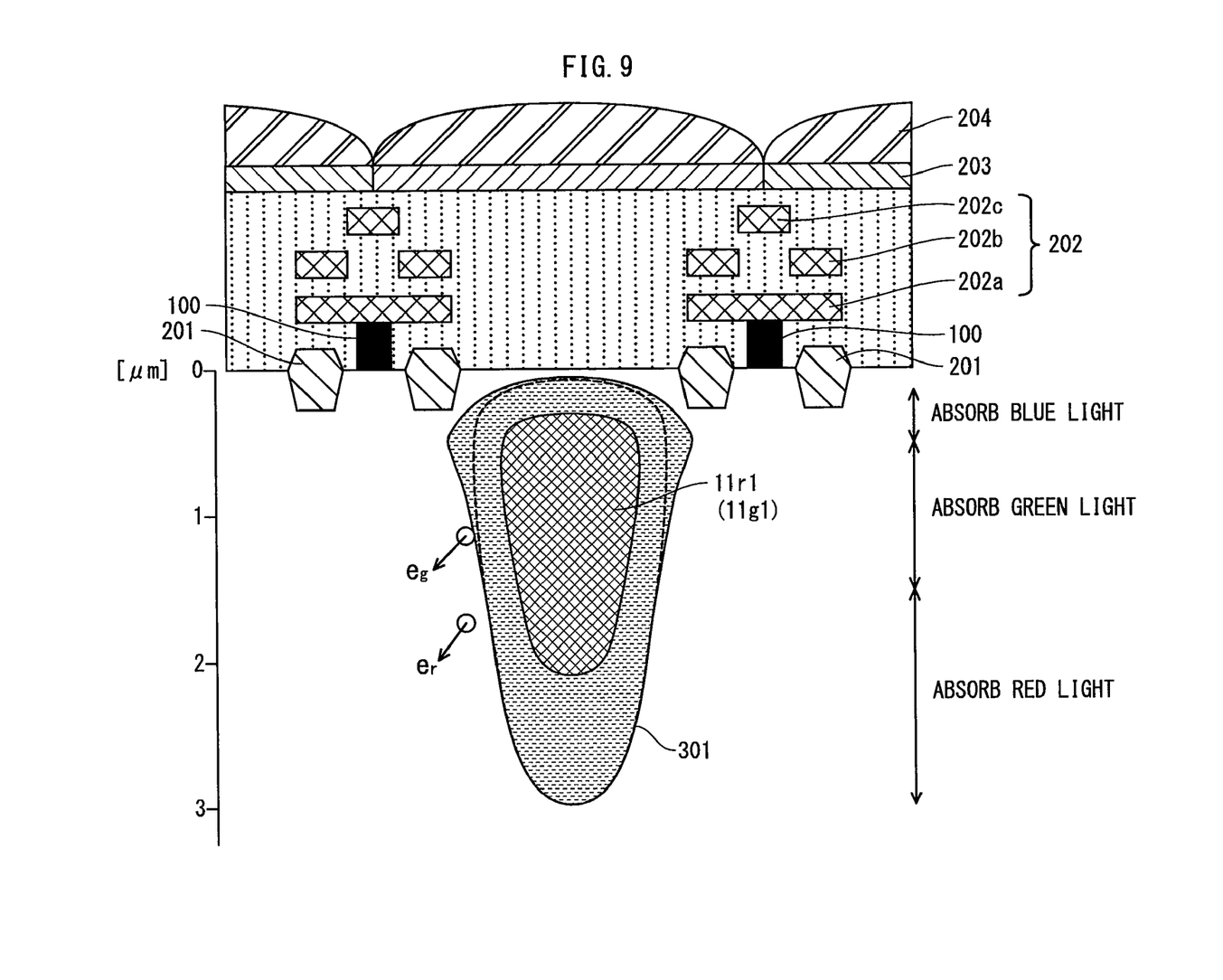
FIG. 9 is a sectional diagram schematically showing the structure of one of a red pixel cell 10 and a green pixel cell 10, and an absorption state of an electron $e_r$ ($e_g$) with respect to the photodiode 11r1 (11g1)
Figure 10:
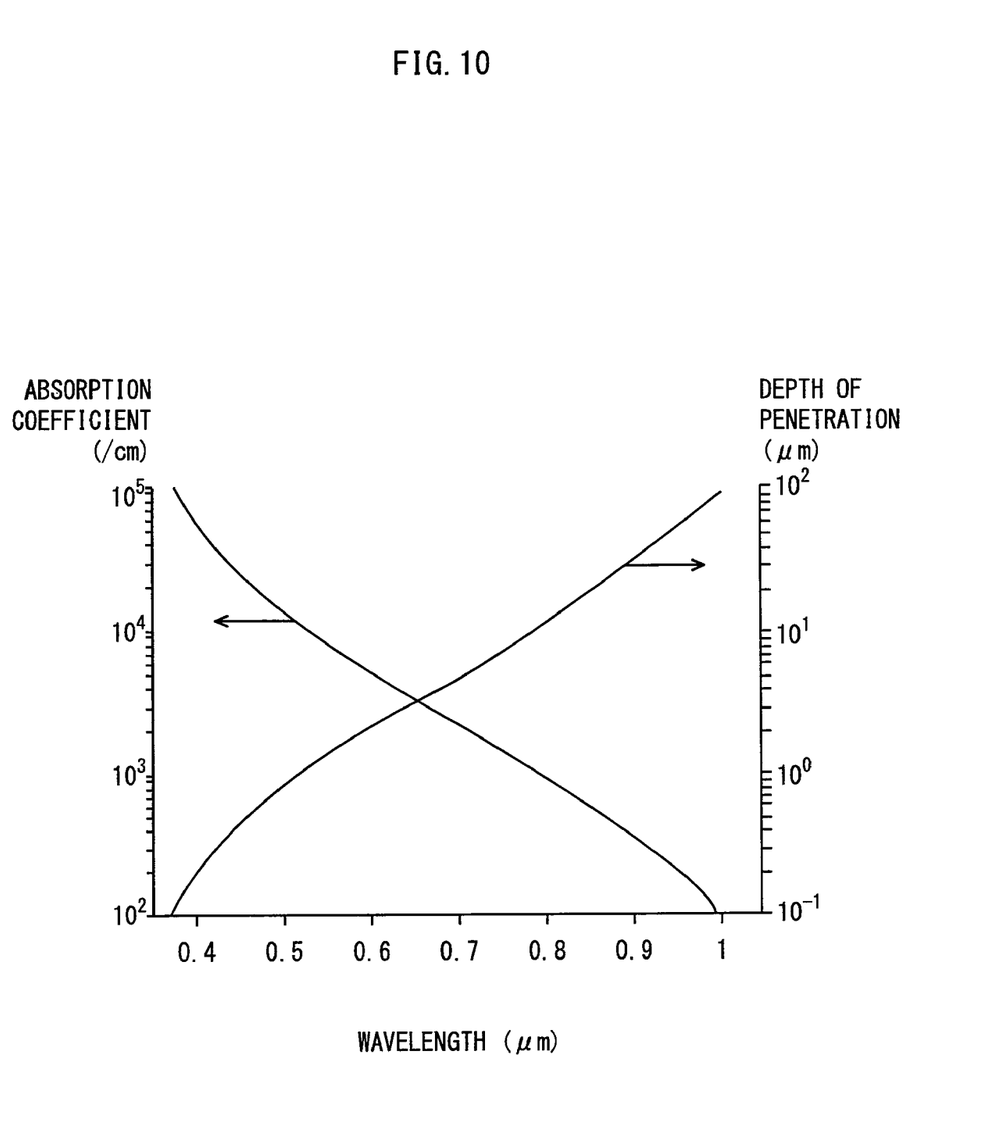
FIG. 10 is a characteristic diagram showing an optical absorption length of light in a silicon substrate, the light being within a visible spectrum (obtained from Japanese National Publication of the Translated Version of PCT Application, No. 2002-513145)

The following describes the superiority of the MOS type solid state imaging device 1 according to embodiment 1, with reference to FIGS. 8 to 10. FIG. 8 is a sectional diagram schematically showing the structure of the blue pixel cell 10, and an absorption state of an electron $e_b$ with respect to the photodiode 11b1, and FIG. 9 is a sectional diagram schematically showing the structure of one of the red pixel cell 10 and the green pixel cell 10, and an absorption state of an electron $e_r$ ($e_g$) with respect to the photodiode 11r1 (11g1).

The MOS type solid state imaging device 1 according to embodiment 1 includes the plurality of substrate contacts 101-104, . . . that have been formed in the pixel region 21. The plurality of substrate contacts 101-104, . . . are used to set the potential (well potential) of the semiconductor substrate to a reference potential (for example, 0 [V]). This stabilizes the potential (well potential) of the semiconductor substrate of the MOS type solid state imaging device 1, thereby operating the transistors 12-15 in each pixel cell 10 at high speed and in a stable manner.

As shown in FIG. 8, isolations 201 have been formed in a region in the vicinity of the blue pixel cell 10, so as to surround both sides of the upper portion of the photodiode 11b1. Then, without providing any substrate contacts, wiring lines 202 (wiring layers 202a, 202b, and 202c), a color filter 203, and a top lens 204 have been formed above each of the isolations 201.

As shown in FIG. 9, the isolations 201 have been formed in a region in the vicinity of one of the red pixel cell 10 and the green pixel cell 10, so as to surround both sides of the upper portion of the photodiode 11*r*1 (11*g*1). Then, a substrate contact 100 (equivalent to 101-104, ...) is provided so as to be sandwiched between each of the isolations 201. Each of the substrate contacts 100 is connected to the wiring layer 202*a*, and receives a reference potential via the wiring layer 202*a*.

In other words, in the MOS type solid state imaging device 1, the distribution of the substrate contacts 100 is denser in the regions that are in the vicinity of the photodiode 11*r*1 (11*g*1) in the red pixel cell 10 and the green pixel cell 10, than the region that is in the vicinity of the photodiode 11*b*1 in the blue pixel cell 10.

As described above, in the MOS type solid state imaging device 1 according to embodiment 1, the substrate contacts 100 have been formed in the region that is in the vicinity of one of the red pixel cell 10 and the green pixel cell 10, and not in the region in the vicinity of the blue pixel cell 10. With this structure, the dividing ridge (boundary where electrons generated by photoelectric conversion are absorbed by the photodiode 11*b*1) does not spread even along the substrate surface in the blue pixel cell 10, as shown in FIG. 8. As a result, although blue light having a wavelength in the range in of 400 [nm] to 490 [nm] is photoelectrically converted in a region that is shallow (approximately in the range of 0.2 [μm] to 0.5 [μm] inclusive) from the substrate surface, the electrons $e_b$ generated in the peripheral region of the photodiode 11*b*1 in the blue pixel cell 10 are not concentrated on the photodiode 11*b*1, since no substrate contact is provided in the vicinity of the blue pixel cell 10.

Here, as shown in FIG. 10 (cited from Japanese National Publication of the Translated Version of PCT Application, No. 2002-513145), a large part of blue light having a peak wavelength in the range of 400 [nm] to 490 [nm] inclusive is absorbed by the semiconductor substrate at a depth of approximately 0.2 [μm] to 0.5 [μm].

On the other hand, a large part of green light having a peak wavelength in the range of 490 [nm] to 575 [nm] inclusive is absorbed by the semiconductor substrate at a depth of approximately 0.5 [μm] to 1.5 [μm], and a large part of red light having a peak wavelength in the range of 575 [nm] to 700 [nm] inclusive is absorbed by the semiconductor substrate at a depth of approximately 1.5 [μm] to 3.0 [μm].

Therefore, the MOS type solid state imaging device 1 prevents blue light from being excessively concentrated on the photodiode 11*b*1 in a shallow region of the substrate, by not providing any substrate contact 100 in the vicinity of the photodiode 11*b*1 in the blue pixel cell 10.

Also, as shown in FIG. 6, in the MOS type solid state imaging device 1, the substrate contacts 101-104 have been formed on the positions corresponding to the center points of the photodiodes 11*r*1 and 11*g*1-11*g*2 in the Y-axial direction. In other words, the substrate contacts 101-104 have been arranged on the virtual line L that passes between the centers of the photodiodes 11*r*1 and 11*g*2. Therefore, even in the red and green pixel cells 10, the effects of the substrate contacts 101-104 on the photodiodes 11*g*1, 11*r*1, and 11*g*2 are equalized at least along the Y-axial direction.

Furthermore, as shown in FIG. 6, the substrate contact 102 is not arranged midway between the photodiode 11*g*1 and the photodiode 11*r*1, and the substrate contact 103 is not arranged midway between the photodiode 11*r*1 and the photodiode 11*g*2. Instead, each of the substrate contacts 102 and 103 is arranged so as to be closer to the red pixel cell 10*r*1. This makes it possible to further reduce the effects of the substrate contacts 102 and 103 on the green pixel cells 10*g*1 and 10*g*2 that each receive green light whose wavelength is shorter than red light.

With the above-described structure, the MOS type solid state imaging device 1 according to embodiment 1 ensures high speed and stable operation of the transistors 12-15 in each pixel cell 10, with the substrate contacts 101-104 formed therein, and also prevents the occurrence of shading with the arrangement of the substrate contacts 101-104. This technique is useful when further reducing the size of each pixel cell.

Embodiment 2

Figure 11:
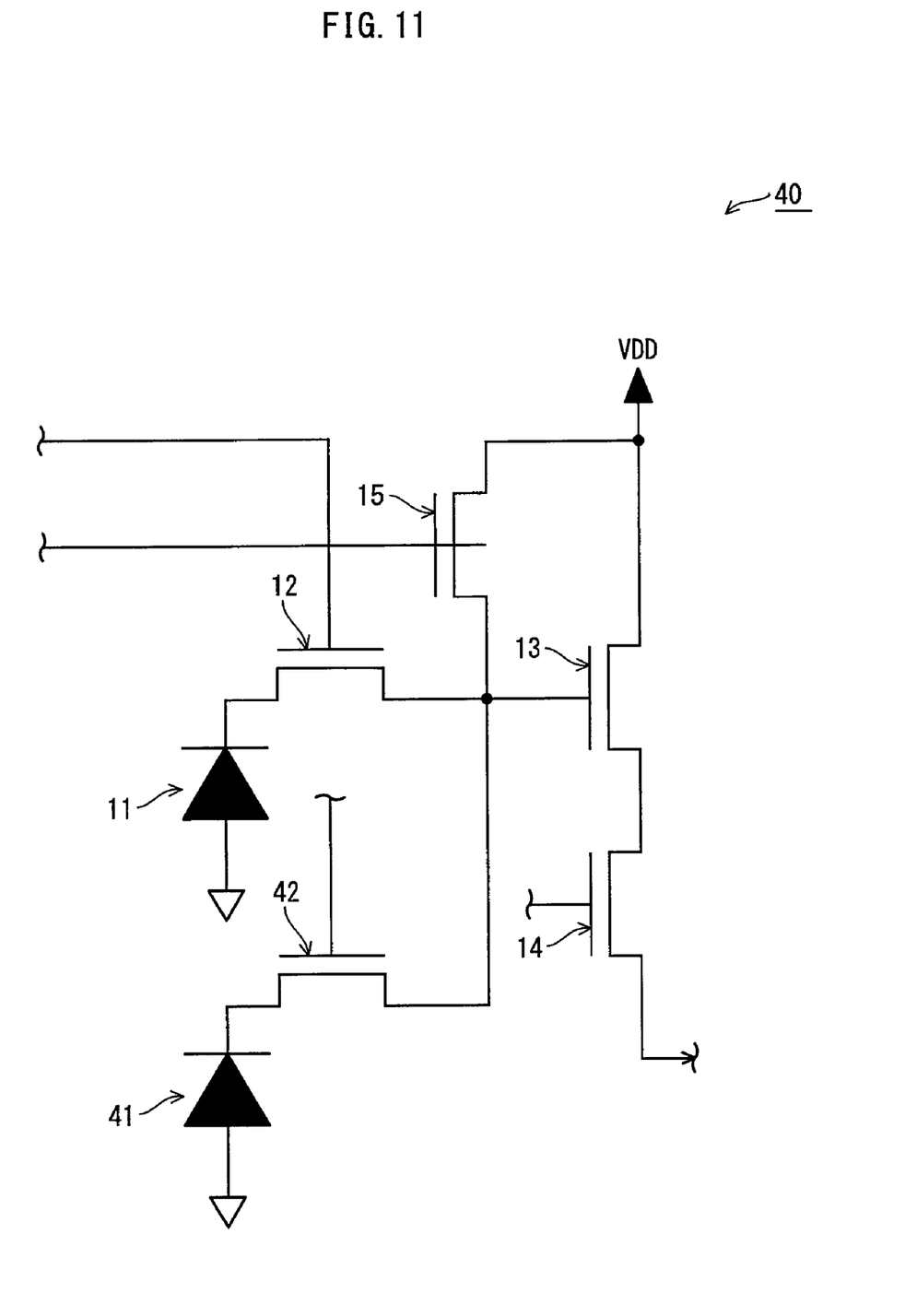
FIG. 11 is a circuit diagram showing the structure of a pixel cell 40 in a MOS type solid state imaging device according to embodiment 2.
Figure 12:
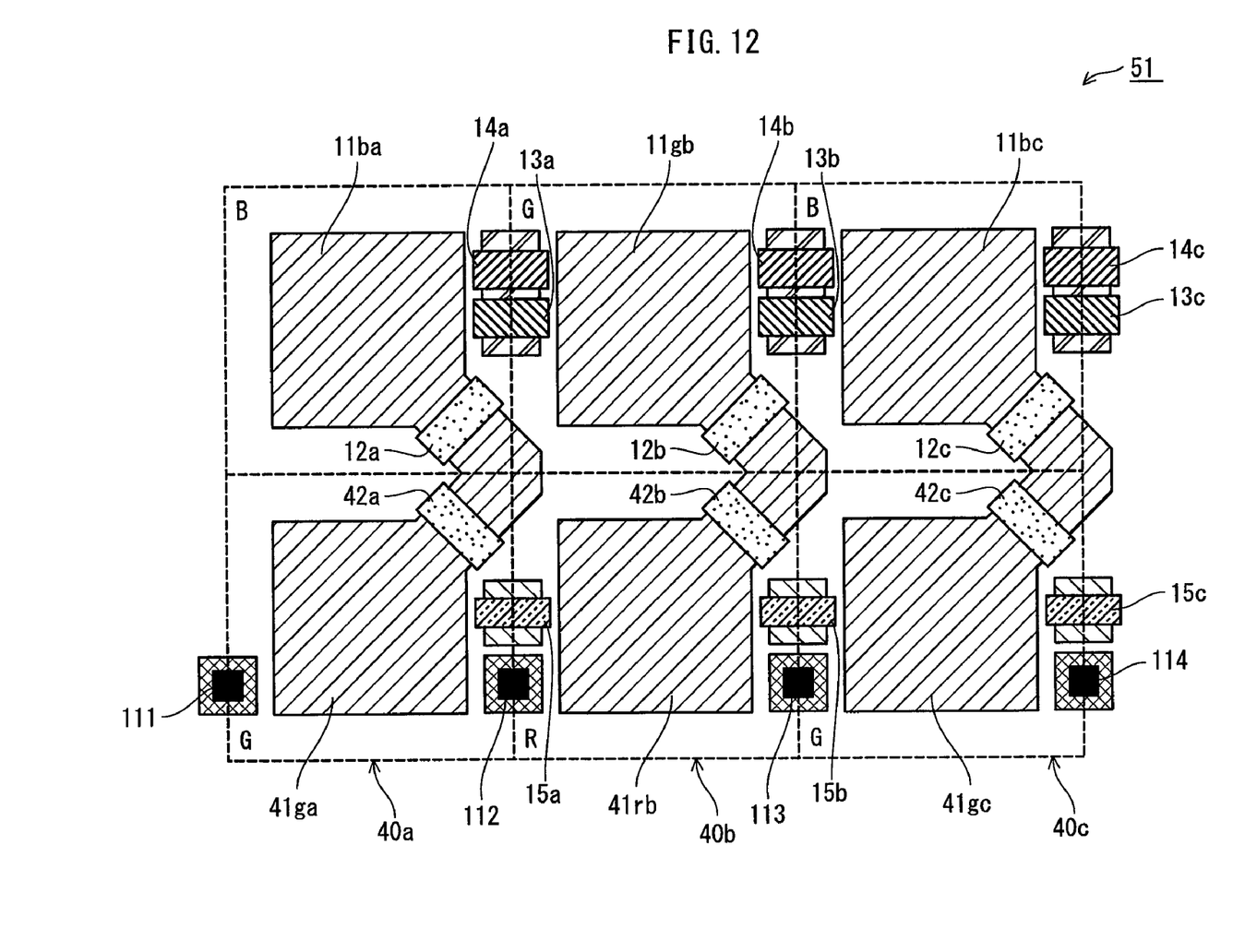
FIG. 12 is a schematic layout showing a relative positional relationship between (i) photodiodes 11ba, 11gb, 11bc, 41ga, 41rb, and 41gc and (ii) substrate contacts 111-114, in a pixel region 51 of the MOS type solid state imaging device according to embodiment 2.

The following describes the structure of a MOS type solid state imaging device according to embodiment 2, with reference to FIGS. 11 and 12. Note that each of FIGS. 11 and 12 shows some of pixel cells 40 (40*a*, 40*b*, and 40*c*) in a pixel region 51. The rest of the structure of the MOS type solid state imaging device according to embodiment 2 is basically the same as that of the MOS type solid state imaging device 1 according to embodiment 1 described above.

As shown in FIG. 11, two photodiodes, namely photodiodes 11 and 41 have been formed in each of the pixel cells 40, in the MOS type solid state imaging device according to embodiment 2. Also, transfer transistors 12 and 42 have been formed with respect to the photodiodes 11 and 41 in each pixel cell 40. The rest of the structure of each pixel cell 40 is the same as that of each pixel cell 10.

As shown in FIG. 12, when three pixel cells, namely pixel cells 40*a*, 40*b*, and 40*c* are seen by being extracted from the pixel region 51, the pixel cells 40*a*, 40*b*, and 40*c* have been arranged in the direction of rows. In the pixel cell 40*a*, a photodiode 11*ba* for blue light and a photodiode 41*ga* for green light have been formed as a pair. The photodiode 11*ba* and the photodiode 41*ga* are connected to a transfer transistor 12*a* and a transfer transistor 42*a*, respectively, and share an amplification transistor 13*a*, a selection transistor 14*a*, and a reset transistor 15*a*.

In the same manner, a photodiode 11*gb* for green light and a photodiode 41*rb* for red light have been formed as a pair in the pixel cell 40*b*, and a photodiode 11*bc* for blue light and a photodiode 41*gc* for green light have been formed as a pair in the pixel cell 40*c*.

As shown in FIG. 12, in the pixel region 51 of the MOS type solid state imaging device according to embodiment 2, substrate contacts 111-114 have been formed in the vicinity of the photodiodes 41*ga*, 41*rb*, and 41*gc* that have been arranged in a lower row of the pixel cells 40*a*, 40*b*, and 40*c*, whereas no substrate contact has been formed in the vicinity of the photodiodes 11*ba*, 11*gb*, and 11*bc* that have been arranged in an upper row of the pixel cells 40*a*, 40*b*, and 40*c*. Note that the substrate contacts 111-114 are different from those in the MOS type solid state imaging device 1 according to the above-described embodiment 1, in that the substrate contacts 111-114 have not been formed on a line connecting the center points of the photodiodes 41*ga*, 41*rb*, and 41*gc* in the lower row. However, it is of course possible to arrange the substrate contacts 111-114 on the line connecting the center points, by devising the arrangement of the reset transistors 15*a*, 15*b* and 15*c*, in the same manner as the above-described embodiment 1.

As described above, the MOS type solid state imaging device according to embodiment 2 adopts a so-called two-pixel one-cell structure, and achieves the same advantageous effect as the MOS type solid state imaging device 1 according to the above-described embodiment 1, by adopting the arrangement of the substrate contacts 111-114 shown in FIG. 12. In other words, the MOS type solid state imaging device according to embodiment 2 also effectively prevents shading, while ensuring high speed and stable operation of the transistors 12-15 and 42 in the pixel cell 40.

Note that, in the MOS type solid state imaging device according to embodiment 2, the substrate contacts 111-114 have not been arranged adjacent to the transfer transistors 42a, 42b, and 42c in each of the pixel cells 40a, 40b, and 40c. Instead, the reset transistors 15a, 15b, and 15c have been arranged between the substrate contacts 111-114 and the transfer transistors 42a, 42b, and 42c, as shown in FIG. 12. Therefore, in the MOS type solid state imaging device according to embodiment 2, it is possible to minimize a difference in the sensitivity characteristic between each pair of photo diodes in the respective pixel cells 40a, 40b, and 40c, namely between the photodiodes 11ba and 41ga in the pixel cell 40a, the photodiodes 11gb and 41rb in the pixel cell 40b, and the photodiodes 11bc and 41gc in the pixel cell 40c.

In other words, the MOS type solid state imaging device according to embodiment 2 also adopts the structure as shown in FIG. 5, in which the n-type doped region 11n in the photodiode 11 (41) has been extended to the region located below the transfer transistor 12 (42). Therefore, if the substrate contacts 111-114 have been arranged adjacent to the transfer transistors 42, a difference in the sensitivity characteristic is likely to occur between each pair of photodiodes 11ba and 41ga, the photodiodes 11gb and 41rb, and the photodiodes 11bc and 41gc, due to the influence of the substrate contacts 111-114.

On the other hand, as shown in FIG. 12, in the MOS type solid state imaging device according to embodiment 2, the reset transistors 15a, 15b, and 15c have been arranged between the transfer transistors 42a, 42b, and 42c and the substrate contacts 111-114, thereby minimizing a difference in the sensitive characteristic between each pair of photodiodes 11ba and 41ga, the photodiodes 11gb and 41rb, and the photodiodes 11bc and 41gc. The structure in which the reset transistors have been arranged in between can be adopted for the above-described solid state imaging device 1 according to embodiment 1 that has the one-pixel one-cell structure. In this case, it is also possible to achieve an advantageous effect of suppressing the effect of the substrate contacts on the transfer transistors.

Note that devices that have been arranged between the substrate contacts 111-114 and the transfer transistors 42a, 42b, and 42c are not limited to the reset transistors 15a, 15b, and 15c. Instead, it is possible to use devices other than the reset transistors 15a, 15b, and 15c.

<Supplementary Remarks>

In the above-described embodiments 1 and 2, the substrate contacts 110-104 and 111-114 have not been arranged in the vicinity of the photodiodes 11b1 and 11b2 in the blue pixel cells 10, or the photodiodes 11ba and 11bc in the blue pixel cells 40. However, it is not the intention of the present invention that the substrate contacts should not be arranged in the vicinity of the photodiodes in the blue pixel cells. In the present invention, it is acceptable as long as the distribution of the substrate contacts is denser in the vicinity of the red and green pixel cells (the substrate contacts in the vicinity of the photodiodes in a first group) than the substrate contacts in the vicinity of in the blue pixel cells (the substrate contacts in the vicinity of the photodiodes in a second group). Here, color filters above the photodiodes in the first group have the longer transmission peak wavelength, and color filters above the photodiodes in the second group have the shorter transmission peak wavelength.

Also, one example used in the above-described embodiment 2 is the MOS type solid state imaging device including the pixel region 51 that has a two-pixel one-cell structure. However, the present invention can of course be applied to a MOS type solid state imaging device that has a multi-pixel one-cell structure, such as a four-pixel one-cell structure or a six-pixel one-cell structure. Note that, in a case where the present invention is applied to the MOS type solid state imaging device that has a multi-pixel one-cell structure, it is not always necessary to share the diffusion part for the drains of transfer transistors, as shown in embodiment 2. Instead, each of the diffusion parts may be provided for the respective transfer transistors, so as to be electrically connected to the shared amplification transistor.

Also, the above-described embodiments 1 and 2 adopted, as one example, the structure where the plurality of pixel cells 10 and 40 have been arranged in a matrix (array). However, the present invention may be applied to a MOS type solid state imaging device that has a structure where a plurality of pixel cells have been arranged in a honeycomb pattern.

In the above-described embodiments 1 and 2, a primary-color filter is assumed to be used as the color filter 203. However, it is possible to use a complementary-color filter or a multilayer interference filter instead.

Also, FIG. 12 shows three pixel cells in one row, namely the pixel cells 40a, 40b, and 40c. However, more pixel cells of course exist in the upward and downward directions of the pixel cells 40a, 40b, and 40c. In this case, the arrangement of each pair of photodiodes in the respective pixel cells in each row may be flipped upside down, so that the spacing between the substrate contacts 111-114 and the photodiodes of the blue pixel cells is greater than the spacing between the substrate contacts 111-114 and the photodiodes of the other pixel cells. In this way, the spacing between the substrate contact and the photodiode having the blue color filter is larger than the spacing between the substrate contact and the photodiode having one of the red and green color filters, even among the pixel cells belonging to the same column.

Also, the structure according to the present invention may be adopted to a solid state imaging device having a one-pixel one-cell structure and a solid state imaging device having a multi-pixel one-cell structure, as well as the solid-state imaging devices according to the above-described embodiments 1 and 2. In this case, it is also possible to achieve the same effect as described above.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A solid state imaging device comprising:
   a plurality of photodiodes that have been arranged two-dimensionally with spacing between each other, in a semiconductor substrate, each of the photodiodes having a function of photoelectric conversion;
   a plurality of kinds of color filters, each of the color filters having been formed above the respective photodiodes and transmitting light that has, for each kind, a different peak wavelength;
   a plurality of substrate contacts that have been respectively arranged in vicinity of some or all of the plurality of photodiodes, so as to apply a reference voltage to the semiconductor substrate, wherein
   the plurality of photodiodes include photodiodes that belong to a first group and photodiodes that belong to a second group such that color filters above the photodiodes of the first group have a longer transmission peak wavelength, and color filters above the photodiodes of the second group have a shorter transmission peak wavelength, and a distribution of the substrate contacts is denser in vicinity of the photodiodes in the first group than in vicinity of the photodiodes in the second group.

2. The solid state imaging device of claim 1, wherein a region where the plurality of photodiodes have been arranged two-dimensionally includes a portion where a first photodiode is adjacent to a second photodiode, the first photodiode being one of the photodiodes that belongs to the first group, the second photodiode being one of the photodiodes that belongs to the second group, one of the plurality of substrate contacts having been formed between the first photodiode and the second photodiode, and in the portion, the one of the substrate contacts has been formed so as to be closer to the first photodiode than the second photodiode.

3. The solid state imaging device of claim 1, wherein a region where the plurality of photodiodes have been arranged two-dimensionally includes a portion where at least three of the substrate contacts have been formed, and the at least three of the substrate contacts have been formed at a constant pitch.

4. The solid-state imaging device of claim 1, wherein in correspondence with each of the photodiodes, a transfer transistor has been formed, a source of which is connected to one end of the photodiode, an amplification transistor has been formed that is connected to a drain of the transfer transistor, and amplifies a potential of the drain, a reset transistor that initializes a potential level of the drain in the transfer transistor, and in a portion where one of the substrate contacts has been formed in vicinity of one of the photodiodes, either the amplification transistor or the reset transistor has been formed between the one of the substrate contacts and the one of the transfer transistors.

5. The solid-state imaging device of claim 1, wherein a region where the plurality of photodiodes have been arranged two-dimensionally includes pixel cells each having two or more of the photodiodes that are adjacent to each other, each of the pixel cells includes two or more transfer transistors, an amplification transistor, and a reset transistor, the two or more transfer transistors corresponding to the two or more photodiodes respectively, including a source connected to one end of each of the two or more photodiodes, and sharing a drain, the amplification transistor connected to the drain of the two or more transfer transistors, and amplifying a potential of the drain, the reset transistor initializing a potential level of the drain of the two or more transfer transistors, and in a portion where one of the substrate contacts has been formed in vicinity of one of the photodiodes, either the amplification transistor or the reset transistor has been formed between (i) the one of the substrate contacts and (ii) the two or more transfer transistors.

6. The solid state imaging device of claim 1, wherein the photodiodes that belong to the first group receive, via the color filters formed thereabove, light having a peak wavelength in a range of 575 nm to 700 nm inclusive, and the photodiodes that belong to the second group receive, via the color filters formed thereabove, light having a peak wavelength in a range of 400 nm to 490 nm inclusive.

* * * * *